United States Patent
Daniel et al.

(10) Patent No.: US 9,374,899 B2
(45) Date of Patent: Jun. 21, 2016

(54) GOLD PAD MINI PCB MODULE

(71) Applicant: Continental Automotive Systems, Inc., Auburn Hills, MI (US)

(72) Inventors: Daniel Bracamontes Daniel, Tlaquepaque (MX); Irving Morales Rodriquez, Guadalajara (MX); Anel Ortiz Gonzalez, Zapopan (MX); Gil Rene Sosa Cano, Zapopan (MX); Jurgen Christian Hagedorn Millard, Guadalajara (MX)

(73) Assignee: Continental Automotive Systems, Inc., Auburn Hills, MI (US)

( * ) Notice: Subject to any disclaimer, the term of this patent is extended or adjusted under 35 U.S.C. 154(b) by 390 days.

(21) Appl. No.: 13/725,922

(22) Filed: Dec. 21, 2012

(65) Prior Publication Data

US 2014/0177175 A1    Jun. 26, 2014

(51) Int. Cl.
*H05K 7/06* (2006.01)
*H05K 1/14* (2006.01)
*H05K 3/24* (2006.01)
*H05K 3/36* (2006.01)

(52) U.S. Cl.
CPC ............... *H05K 1/141* (2013.01); *H05K 3/243* (2013.01); *H05K 3/368* (2013.01)

(58) Field of Classification Search
CPC .......... H05K 1/09; H05K 1/142; H05K 1/144
USPC .......... 361/736, 748, 735, 807; 174/257, 260; 257/780
See application file for complete search history.

(56) References Cited

U.S. PATENT DOCUMENTS

| | | | |
|---|---|---|---|
| 4,261,042 A * | 4/1981 | Ishiwatari et al. ............ 708/138 |
| 2004/0072453 A1 * | 4/2004 | Stillabower et al. ............ 439/74 |
| 2006/0032665 A1 * | 2/2006 | Ice .................. 174/254 |
| 2007/0222469 A1 * | 9/2007 | Ger et al. ...................... 324/763 |
| 2008/0239621 A1 * | 10/2008 | Tajuddin et al. ........... 361/306.1 |
| 2009/0160471 A1 * | 6/2009 | Kim et al. ..................... 324/758 |

* cited by examiner

*Primary Examiner* — Dion R Ferguson
*Assistant Examiner* — Mandeep Buttar

(57) ABSTRACT

A printed circuit board (PCB) assembly includes a first printed circuit board that includes first circuit traces formed of copper. A second printed circuit board includes second circuit traces that are formed of nickel/gold plated copper and terminations that are soldered to the first circuit traces. An electrical component contacts the second circuit traces.

11 Claims, 1 Drawing Sheet

GOLD PAD MINI PCB MODULE

CROSS REFERENCE TO RELATED APPLICATIONS

This application claims priority to U.S. provisional application Ser. No. 61/579,121, filed Dec. 22, 2011, the contents of which are incorporated by reference herein.

FIELD

The present disclosure relates to construction of electrical printed circuit boards and more particularly to stacked printed circuit boards with different metals used for the traces on respective boards.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Electrical printed circuit boards (PCB) are well known in the art. Generally PCBs comprise an insulating substrate that is glued to a thin layer of conductive metal. The insulating substrate is chosen from a number of materials such as fiberboard, fiberglass, flexible polyamide and the like. The choice of substrate material is generally dictated by temperature specifications, cost, and need for mechanical flexibility such as bending.

The conductive metal is generally copper however other metals can also be used depending on the situation. An etching mask is applied to the conductive metal and defines the shape of the circuit traces that will be formed on the PCB. An etching solution then dissolves away the portions of the conductive metal that are not protected by the etching mask. When the etching mask is removed the desired circuit traces are all that remain of the conductive metal.

Some applications demand that the metal be resistant to corrosion and wear. In those cases it is common to plate the copper with nickel and gold, however such a coating is undesirably expensive.

Referring now to FIG. 1, a cross section is shown of a typical PCB 10 of the prior art. PCB 10 includes a substrate 12. Circuit traces 14-1, 14-2, and 14-3, collectively referred to as circuit traces 14, are formed as described above. In this example a pushbutton switch 16 is also shown attached to PCB 10. Pushbutton switch 16 includes a pliable body 18 and a conductive pill 20. A user can press the top of switch 16 such that pliable body 18 deforms and allows conductive pill 20 to make a circuit between circuit traces 14-1 and 14-2. When the user releases button 16 pliable body 18 returns to its original shape and the circuit is reopened. Such a combination of PCB 10 and switch 16 are commonly used in keypads for devices such a cell phones, automobile radios, and the like.

An undesirable characteristic of PCB 10 is that an extra expense in incurred if circuit traces 14-1 and 14-2 need to be coated with nickel/gold to increase the durability and/or current carrying capacity in combination with switch 16. The extra expense comes by virtue of having to also coat circuit trace 14-3 along with circuit traces 14-1 and 14-2. It is impractical to coat a subset of traces 14. Instead it is more simple to coat all traces 14 simultaneously.

SUMMARY

A printed circuit board (PCB) assembly includes a first printed circuit board that includes first circuit traces formed of copper. A second printed circuit board includes second circuit traces that are formed of nickel/gold plated copper and terminations that are soldered to the first circuit traces. An electrical component contacts the second circuit traces.

In other embodiments the terminations comprise a lead frame. The electrical component can include a pushbutton switch that includes a conductive pill that contacts the second circuit traces.

In yet other embodiments the electrical component can include an elastomeric connector with a first termination side that contacts the second circuit traces. A display contacts a second termination side of the elastomeric connector and communicates with the second circuit traces.

A PCB assembly includes first printed circuit board means that includes first circuit traces formed of copper, second printed circuit board means that includes second circuit traces that are formed of nickel/gold plated copper and termination means for soldering to the first circuit traces, and electrical component means for contacting the second circuit traces.

In other embodiments the termination means includes a lead frame. The electrical component means can include a pushbutton switch that includes a conductive pill for contacting the second circuit traces.

In yet other embodiments the electrical component means can include an elastomeric connector means for contacting the second circuit traces. The PCB assembly can also include display means for displaying and means for contacting the elastomeric connector means and communicating with the second circuit traces.

A printed circuit board (PCB) assembly includes a first printed circuit board that includes first circuit traces formed of copper. A second printed circuit board includes second circuit traces that are formed of nickel/gold plated copper and a lead frame that is soldered to the first circuit traces. An elastomeric connector includes first and second termination sides that respectively contact the second circuit traces and a display that communicates with the second circuit traces.

A method of manufacturing a printed circuit board (PCB) assembly includes providing a first printed circuit board that includes first circuit traces formed of copper, providing a second printed circuit board that includes terminations and second circuit traces that are formed of nickel/gold plated copper, soldering the terminations to the first circuit traces, and applying an electrical component that contacts the second circuit traces.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
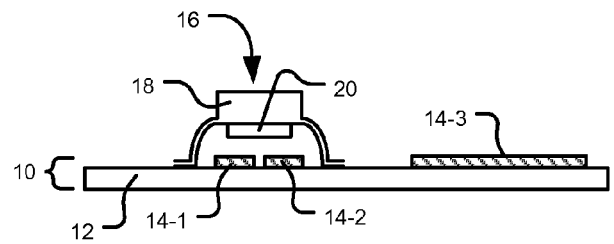
FIG. 1 is a cross section of a printed circuit board (PCB) of the prior art.

The following description is merely exemplary in nature and is in no way intended to limit the disclosure, its application, or uses. For purposes of clarity, the same reference numbers will be used in the drawings to identify similar elements. As used herein, the phrase at least one of A, B, and C should be construed to mean a logical (A or B or C), using a non-exclusive logical or. It should be understood that steps within a method may be executed in different order without altering the principles of the present disclosure.

Figure 2:
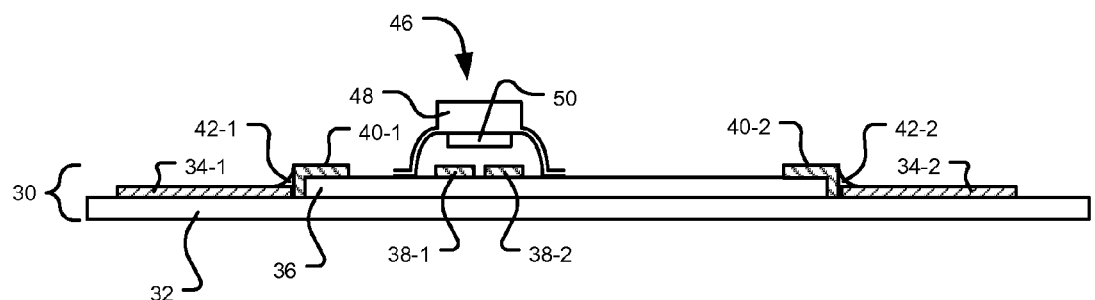
FIG. 2 is a cross section of an improved PCB that includes two types of metallic traces and a pushbutton switch.

Referring now to FIG. 2, a cross section is shown of an improved PCB assembly 30. PCB assembly 30 enables using different types of circuit trace metallurgy in different areas. It therefore avoids unnecessary expense when some portions of PCB assembly 30 use more expensive plating than other areas that do not need the plating.

PCB assembly 30 includes a first substrate 32. First circuit traces 34-1 and 34-2, collectively referred to as first circuit traces 34, are formed of copper using methods that are known in the art and are adhered to first substrate 32. A single sided assembly is shown for simplicity, however those skilled in the art appreciate that multi-sided and multi-layered substrate/trace assemblies are also within the scope of this invention.

PCB assembly 30 also includes a second substrate 36. Second circuit traces 38-1 and 38-2, collectively referred to as second circuit traces 38, are also formed of copper using methods that are known in the art and are adhered to second substrate 36. A single sided assembly is shown for simplicity, however those skilled in the art appreciate that multi-sided and multi-layered substrate/trace assemblies are also within the scope of this invention. Second traces 38 are also nickel/gold plated whereas first circuit traces 34 are not. Second substrate 36 also includes a first termination 40-1 and a second termination 40-2, collectively referred to as terminations 40. While only two terminations 40 are shown it is appreciated by those skilled in the art that more can be used based on the number of electrical connections that need to be made between circuits associated with first substrate 32 and second substrate 36, respectively. While terminations 40 are shown as butted type terminations, it is also appreciated by those skilled in the art that terminations 40 can be formed with a lead frame that provides gullwing leads, J-leads, dual inline package leads, and the like such as are used with integrated circuits. Solder joints 42 connect respective ones of first traces 34 and terminations 40.

In the depicted example a pushbutton switch 46 is also shown attached to second substrate 36. Pushbutton switch 46 includes a pliable body 48 and a conductive pill 50. A user can press the top of switch 46 such that pliable body 48 deforms and allows conductive pill 50 to make a circuit between second traces 38-1 and 38-2. When the user releases button 46 pliable body 48 returns to its original shape and the circuit is reopened. Such a switch 46 is commonly used in keypads for devices such a cell phones, automobile radios, and the like.

Figure 3:
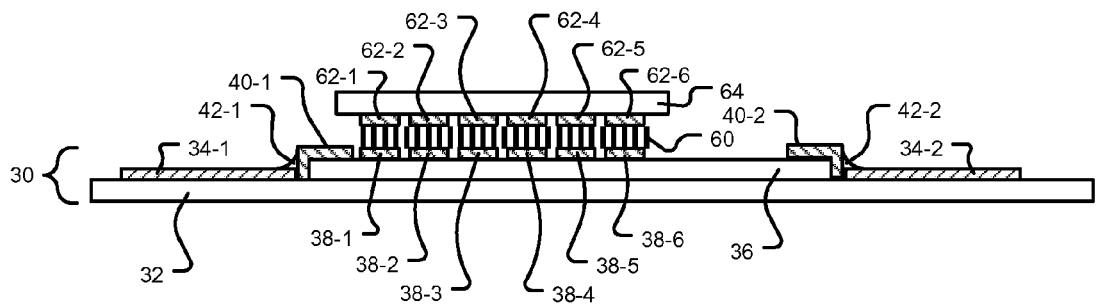
FIG. 3 is a cross section of an improved PCB that includes two types of metallic traces and an elastomeric connector.

Referring now to FIG. 3, a second application is shown for improved PCB assembly 30. In this application nickle/gold plated second traces 38 abut an elastomeric connector strip 60. Elastomeric connector strips are well know to those skilled in the art. An example includes ZEBRA brand connectors available from Fujipoly America Corp. Elastomeric connector strip 60 makes electrical connections between respective ones of second circuit traces 38-1 . . . 38-6 and third circuit traces 62-1 . . . 62-6 that are associated with a display panel 64. While six connections are shown between second circuit traces 38 and third circuit traces 62 are shown it is appreciated by those skilled in the art that more or less can be used.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification, and the following claims.

What is claimed is:

1. A printed circuit board (PCB) assembly, comprising:
    a first printed circuit board having a first insulating substrate that includes first circuit traces formed of copper on the first insulating substrate;
    a second printed circuit board having a second insulating substrate, separate from the first insulating substrate, second circuit traces formed of nickel/gold plated copper are on the second insulating substrate, and the second insulating substrate includes terminations that are soldered to the first circuit traces; and
    an electrical component constructed and arranged to contact the second circuit traces.

2. The PCB assembly of claim 1 wherein the terminations comprise a lead frame.

3. The PCB assembly of claim 1 wherein the electrical component comprises a pushbutton switch that includes a conductive pill that contacts the second circuit traces.

4. The PCB assembly of claim 1 wherein the electrical component comprises an elastomeric connector with a first termination side that contacts the second circuit traces.

5. The PCB assembly of claim 4 that further comprising a display constructed and arranged to be engaged to contact a second termination side of the elastomeric connector and communicates with the second circuit traces.

6. A printed circuit board (PCB) assembly, comprising:
    first printed circuit board means having a first insulating substrate that includes first circuit traces formed of copper on the first insulating substrate;
    second printed circuit board means having a second insulating substrate, separate from the first insulating substrate, second circuit traces formed of nickel/gold plated copper are on the second insulating substrate and the second insulating substrate includes termination means for soldering to the first circuit traces; and
    electrical component means for contacting the second circuit traces.

7. The PCB assembly of claim 6 wherein the termination means comprise a lead frame.

8. The PCB assembly of claim 6 wherein the electrical component means comprises a pushbutton switch that includes a conductive pill that contacts the second circuit traces.

9. The PCB assembly of claim 6 wherein the electrical component means comprises an elastomeric connector means for contacting the second circuit traces.

10. The PCB assembly of claim 9 that further comprising display means for displaying and means for contacting the elastomeric connector means and communicating with the second circuit traces.

11. A printed circuit board (PCB) assembly, comprising:
    a first printed circuit board that includes first circuit traces formed of copper;
    a second printed circuit board, separate from the first circuit board, that includes second circuit traces that are formed of nickel/gold plated copper and includes a lead frame that is soldered to the first circuit traces;
an elastomeric connector with a first termination side that contacts the second circuit traces; and
a display constructed and arranged to be engaged to contact a second termination side of the elastomeric connector and communicates with the second circuit traces.

\* \* \* \* \*

UNITED STATES PATENT AND TRADEMARK OFFICE
CERTIFICATE OF CORRECTION

PATENT NO. : 9,374,899 B2
APPLICATION NO. : 13/725922
DATED : June 21, 2016
INVENTOR(S) : Daniel Bracamontes Salazar et al.

Page 1 of 1

It is certified that error appears in the above-identified patent and that said Letters Patent is hereby corrected as shown below:

On the Title Page

Below Item (65) insert:
--(60) Related U.S. Application Data
Provisional Application No.61/579,121, filed on Dec. 20, 2013.--

Signed and Sealed this
Thirteenth Day of August, 2019

Andrei Iancu
*Director of the United States Patent and Trademark Office*